(12) United States Patent
Heimgärtner et al.

(10) Patent No.: US 6,972,518 B2
(45) Date of Patent: Dec. 6, 2005

(54) DEVICE HAVING A PROTECTIVE SEAL FOR EMITTING ELECTROMAGNETIC RADIATION AND PROCESS FOR PRODUCING THE DEVICE

(75) Inventors: Rudolf Heimgärtner, Oberhinkofen (DE); Franz Petter, Schwabhausen (DE)

(73) Assignee: Infineon Technologies AG, Munich (DE)

(*) Notice: Subject to any disclaimer, the term of this patent is extended or adjusted under 35 U.S.C. 154(b) by 45 days.

(21) Appl. No.: 10/214,899

(22) Filed: Aug. 7, 2002

(65) Prior Publication Data

US 2003/0062829 A1 Apr. 3, 2003

Related U.S. Application Data

(63) Continuation of application No. PCT/EP01/01323, filed on Feb. 7, 2001.

(30) Foreign Application Priority Data

Feb. 7, 2000 (DE) .................................. 100 05 296

(51) Int. Cl.$^7$ .......................................... H05B 33/00
(52) U.S. Cl. ...................................... 313/512; 313/493
(58) Field of Search .............................. 313/512, 506, 313/504, 495, 422, 493

(56) References Cited

U.S. PATENT DOCUMENTS

| | | | |
|---|---|---|---|
| 5,686,790 A | * | 11/1997 | Curtin et al. ............... 313/493 |
| 5,874,804 A | | 2/1999 | Rogers |
| 6,566,808 B1 | * | 5/2003 | Duggal et al. .............. 313/512 |

FOREIGN PATENT DOCUMENTS

| | | |
|---|---|---|
| DE | 198 45 075 A1 | 4/2000 |
| EP | 0 776 147 A1 | 5/1997 |
| EP | 0 859 539 A2 | 8/1998 |
| EP | 0 971 564 A2 | 1/2000 |
| WO | WO 97/46042 | 12/1997 |
| WO | WO 98/53644 | 11/1998 |

OTHER PUBLICATIONS

Burrows, P. E. et al.: "Reliability and Degradation of Organic Light Emitting Devices", Appl. Phys. Lett., vol. 65, No. 23, Dec. 5, 1994, pp. 2922-2924.

* cited by examiner

*Primary Examiner*—Joseph Williams
(74) *Attorney, Agent, or Firm*—Laurence A. Greenberg; Werner H. Stemer; Ralph E. Locher

(57) ABSTRACT

A device for emitting electromagnetic radiation includes a substrate, at least one active layer of a radiation-emitting organic material, a cover, and a seal between the substrate and the cover so that an interior space between the substrate and the cover is closed off in a gas-tight manner. The seal protects the active layer against humidity from the ambient air. By using simple and cost-effective measures, the device thus has a long service life and benefits from all advantages of organic, light-emitting diodes.

19 Claims, 2 Drawing Sheets

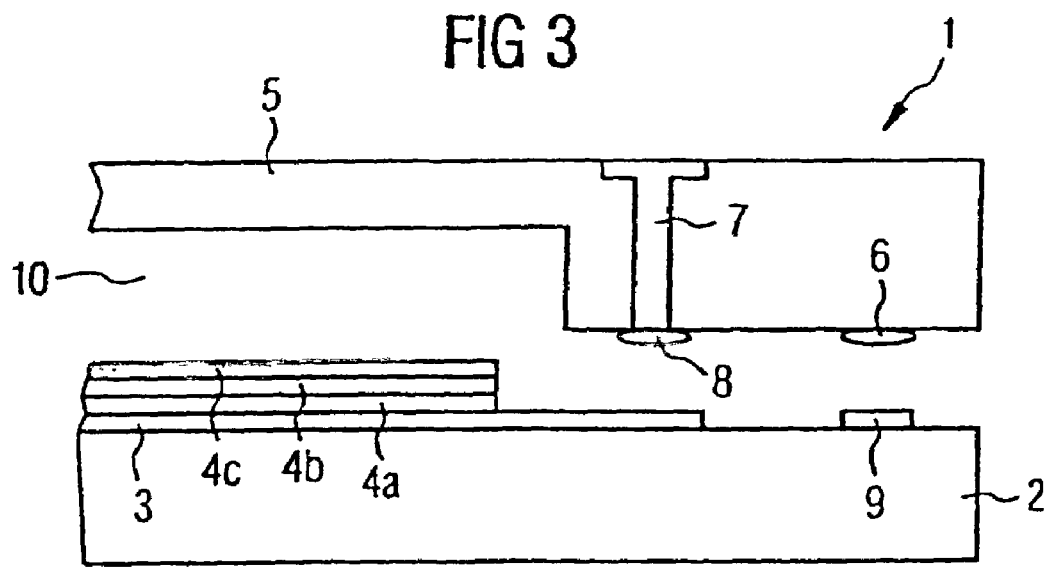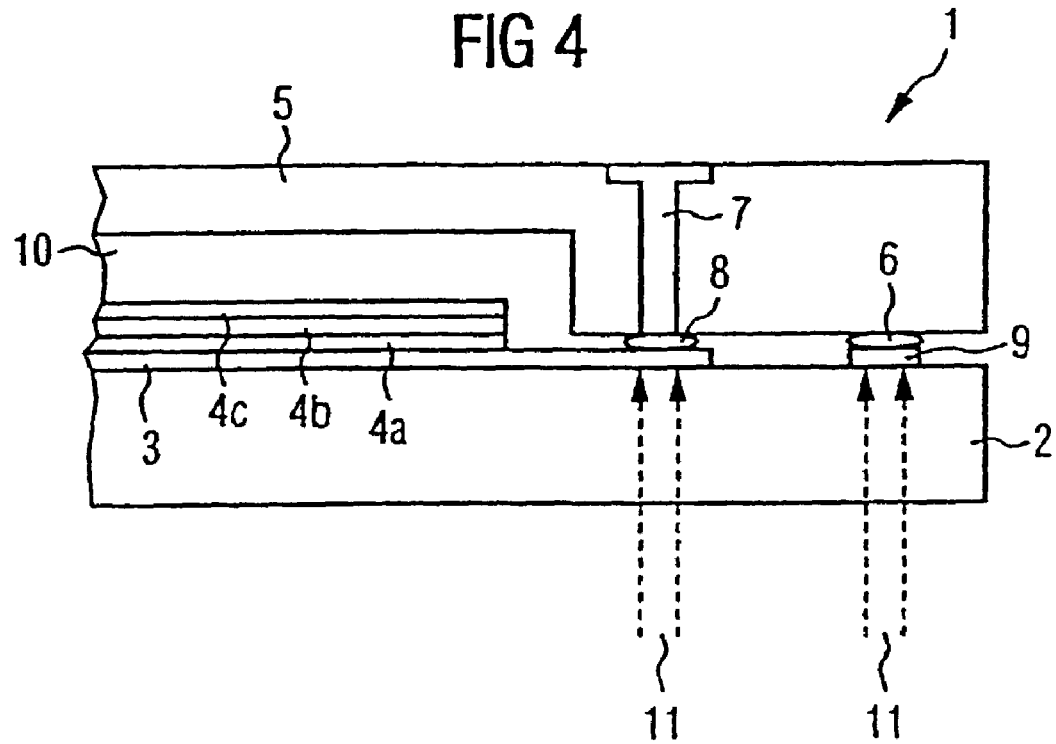

DEVICE HAVING A PROTECTIVE SEAL FOR EMITTING ELECTROMAGNETIC RADIATION AND PROCESS FOR PRODUCING THE DEVICE

CROSS-REFERENCE TO RELATED APPLICATION

This application is a continuation of copending International Application No. PCT/EP01/01323, filed Feb. 7, 2001, which designated the United States and was not published in English.

BACKGROUND OF THE INVENTION

Field of the Invention

The invention relates to a device for emitting electromagnetic radiation, in particular light, and to a process for its production. The invention relates in particular to a display based on organic light-emitting diodes (OLED).

Organic light-emitting diodes have been investigated experimentally for a considerable time and are used in practice. Typically, an organic light-emitting diode includes a substrate, two conductive layers and an active layer, which is arranged between the two conductive layers. Here, the active layer can also be composed of a layer sequence of a plurality of layers. Furthermore, an organic light-emitting diode generally includes two electrodes, which are in each case arranged adjacent to the conductive layers. If a voltage is applied to the diode, then electrons and/or holes flow from the electrodes via the conductive layers into the active layer. When the electrons and the holes meet in the active layer, radiation, normally light, is produced. The wavelength of the radiation produced, that is to say the color of the light produced, depends substantially on the material of the active layer. Typically, at least one of the electrodes is transparent to the radiation produced, so that the radiation produced can be led through this electrode.

As compared with conventional displays, such as LCD displays (liquid crystal displays), organic light-emitting diodes have series of advantages. As a rule, it is sufficient for organic light-emitting diodes to be operated with a low voltage (about 5 volts). Since they also have a relatively high brightness at a low current, they exhibit low energy consumption in conventional applications. If a thin active layer is used, organic light-emitting diodes have very short response times. Furthermore, as compared with LCDs, they can be produced relatively simply and are relatively easy to handle in operation. Because of the fact that organic light-emitting diodes are self-luminous, they are easily perceptible and they can be viewed over a large angular range.

Because of their advantages, displays based on organic light-emitting diodes can be used in a large number of devices.

Examples which may be mentioned here are portable computers, PDAs (personal digital assistants) and portable telephones.

Unfortunately, displays based on organic light-emitting diodes also have a series of serious disadvantages, which have hitherto prevented their wide application. In particular, the stability of the active layer over a long period constitutes a difficult problem. If the active layer comes into contact with moisture or oxygen from the surrounding air, the lifetime of the active layer is reduced considerably. In addition, the material of the electrodes can be damaged by the oxygen in the surrounding air or by the moisture in the surrounding air.

For this reason, an organic light-emitting diode must be protected against influences from the surroundings. Unfortunately, it has been found that the processes and methods which are normally used for the protection of conventional displays cannot be used in displays based on organic light-emitting diodes. For example, resin layers which are used for the protection of conventional displays cannot be used for displays based on organic light-emitting diodes, since solvents which are used for the production of the resin layer penetrate into the active layer and can have a detrimental effect on its characteristics.

SUMMARY OF THE INVENTION

It is accordingly an object of the invention to provide a device for emitting electromagnetic radiation which reduces or eliminates the above-mentioned disadvantages of the heretofore-known devices of this general type. It is furthermore an object of the invention to provide a process for producing such a device.

With the foregoing and other objects in view there is provided, in accordance with the invention, a device for emitting electromagnetic radiation, including:
  a substrate;
  at least one active layer including a radiation-emitting organic material;
  a cover; and
  a seal disposed between the substrate and the cover such that an interior space formed between the substrate and the cover is sealed off in a gastight manner, the seal containing the metals gold and tin or the metals gold and silver.

In other words, according to the invention, a device for emitting electromagnetic radiation is provided which has the following features:
  a substrate;
  at least one active layer of a radiation-emitting organic material;
  a cover for covering the at least one active-layer; and
  a seal between the substrate and the cover, so that an interior space between the substrate and the cover is sealed off in a gastight manner, and wherein the seal contains the metals gold and tin or the metals gold and silver.

The device according to the invention has the advantage that the active layer is protected by the seal against moisture from the surrounding air. Accordingly, the device according to the invention has a long lifetime. Furthermore, all the advantages which are based on the use of organic light-emitting diodes can be exploited in a simple and cost-effective way.

According to a preferred embodiment, the seal is a metallic soldered joint, wherein the seal contains the metals gold and tin or the metals gold and silver.

According to a preferred embodiment, the device has a conductive layer, in particular an ITO (indium-doped tin oxide) layer, between the active layer and the substrate.

Furthermore, it is preferable for conductor tracks to be integrated into the cover. In this case, it is particularly preferred for the conductor tracks integrated into the cover to be connected to the conductive layer via soldered joints. In this way, the seal and the electrical contacts can be produced in one operation or process step. Accordingly, it is possible to dispense with the subsequent formation of the electrical contacts after the formation of the seal. Subsequent formation of the electrical contacts generally means that the electrical contacts have to be led through the seal, which entails an increased outlay on assembly. It is also possible to dispense with an internal connection process, for example making wire contacts.

According to a preferred embodiment, the cover is formed from ceramic material, in particular $Al_2O_3$. Particular preference is given to the use of a so-called "multilayer ceramic," which is constructed from ceramic layers stacked one above another.

Vias are stamped into the individual layers ("green tape") and filled with conductive material. The pattern of the conductor tracks for each layer is then printed onto each layer, so that the individual vias are connected. The layers prepared in this way are then subjected to a heat and pressure treatment, so that a "multilayer ceramic" with integrated conductor tracks is produced.

With the objects of the invention in view there is also provided, a process of producing a device-for emitting electromagnetic radiation, the method includes the steps of:
  providing a substrate;
  providing at least one contact surface on the substrate for a seal;
  applying at least one active layer of a radiation-emitting organic material; and
  sealing off an interior space formed between the substrate and a cover in a gastight manner by soldering the cover to the substrate via the at least one contact surface for producing the seal.

In other words, according to the invention, a process for the production of a device for emitting electromagnetic radiation is provided, includes the following steps:
  a substrate is provided;
  at least one contact surface for a seal is provided on the substrate;
  at least one active layer-formed of a radiation-emitting organic material is applied; and
  a cover is soldered to the substrate via the contact surface, which produces the seal, so that an interior space between the substrate and the cover is sealed off in a gastight manner.

Another mode of the method according to the invention includes providing a conductive layer between the at least one active layer and the substrate.

Yet another mode of the method according to the invention includes providing an indium-doped tin oxide layer as the conductive layer between the at least one active layer and the substrate.

A further mode of the method according to the invention includes integrating conductor tracks into the cover.

Another mode of the method according to the invention includes integrating conductor tracks into the cover; and connecting the conductor tracks to the conductive layer via soldered joints.

Another mode of the method according to the invention includes producing the soldered joints simultaneously with the seal.

A further mode of the method according to the invention includes producing the seal and/or the soldered joints by using a laser beam.

A further mode of the method according to the invention includes using a light-emitting organic material as the radiation-emitting organic material.

It is preferred for the cover to be soldered to the substrate in an inert gas atmosphere.

Other features which are considered as characteristic for the invention are set forth in the appended claims.

Although the invention is illustrated and described herein as embodied in a device for emitting electromagnetic radiation and a process for its production, it is nevertheless not intended to be limited to the details shown, since various modifications and structural changes may be made therein without departing from the spirit of the invention and within the scope and range of equivalents of the claims.

The construction and method of operation of the invention, however, together with additional-objects and advantages thereof will be best understood from the following description of specific-embodiments when read in connection with the accompanying drawings.

BRIEF DESCRIPTION OF THE DRAWINGS

FIGS. 2 to 4 are diagrammatic partial sectional views for illustrating a process according to the invention for producing the device according to FIG. 1.

DESCRIPTION OF THE PREFERRED EMBODIMENTS

Figure 1:
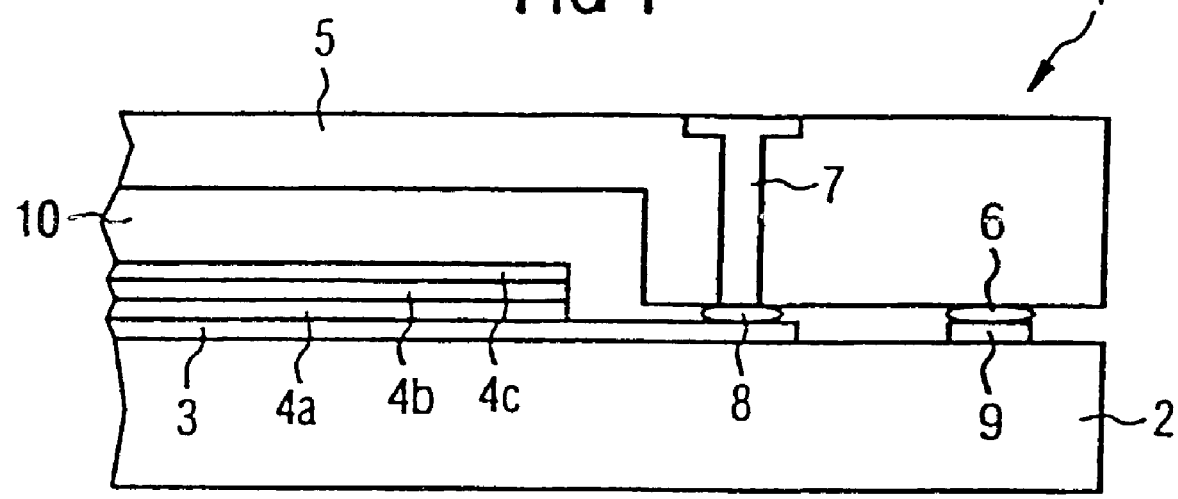
FIG. 1 is a diagrammatic partial sectional view of a device according to one embodiment of the invention.

Referring now to the figures of the drawings in detail and first, particularly, to FIG. 1 thereof, there is shown an embodiment of the present invention. Provided on a substrate 2 which is transparent to radiation, in particular transparent to light, for example a glass substrate, is a conductive layer 3, for example an ITO layer (indium-doped tin oxide). Furthermore, a first active layer 4a is arranged on the conductive layer 3. In the present example, the first active layer 4a contains a p-conductive polymer, for example polyparaphenylene vinylene (PPV), which is used both to conduct positive charge carriers (holes) and for the emission of light. Arranged on the first active layer 4a is a second active layer 4b, which contains an n-conductive material such as PBD (biphenylyl-butylphenyl-oxadiazole compound) embedded in a polystyrene matrix. In this case, the PBD material is used both to conduct the negative charge carriers (electrons) and for the emission of light. An electrode 4c, for example a calcium, lithium/aluminum or magnesium/silver electrode, is in turn provided on the second active layer 4b.

To protect the active layers 4a and 4b and the electrode 4c, a cover 5 is provided, which is joined to the substrate 2 via a seal 6 and electrical contacts 8. To control the active layers 4a and 4b, conductor tracks 7 are in this case provided in the cover 5. The conductor tracks 7 are connected to the conductive layer 3 via the contacts 8. Because of the seal 6, the interior space 10 between the cover 5 and the substrate 2 and, in particular, the active layers 4a and 4b and the electrode 4c are isolated from the surroundings. Accordingly, neither moisture nor oxygen from the surrounding air can damage the active layers 4a and 4b or the electrode 4c. As a result, the lifetime or service life of the active layers 4a and 4b is increased considerably. In the present example, the substrate 2 is formed of glass. Accordingly, the light produced by the active layers 4a and 4b can penetrate the substrate 2.

During the operation of the display shown in FIG. 1, holes from the ITO layer 3 are injected into the p-conductive, active layer 4a and, because of the applied voltage, migrate to the interface between the active layer 4a and the active layer 4b. At the same time, electrons from the electrode 4c are injected into the active layer 4b and, because of the applied voltage, migrate to the interface between the active layer 4a and the active layer 4b. In the vicinity of the interface between the active layer 4a and the active layer 4b, the electrons recombine with the holes, so that light is emitted. The light emitted from the active layers 4a and 4b penetrates through the ITO layer 3 and the substrate 2 and can be used for the display of information.

In the following text, a process according to the invention will be described which can be used for the production of a display based on organic light-emitting diodes, as shown in FIG. 1. For this purpose, a substrate 2 made of glass is provided. A conductive layer 3 is subsequently applied to the substrate. The application of the conductive layer 3 can be carried out, for example, by a CVD process (chemical vapor deposition). The conductive layer 3 is then structured, in order for example to produce the contact surfaces 9.

Figure 2:
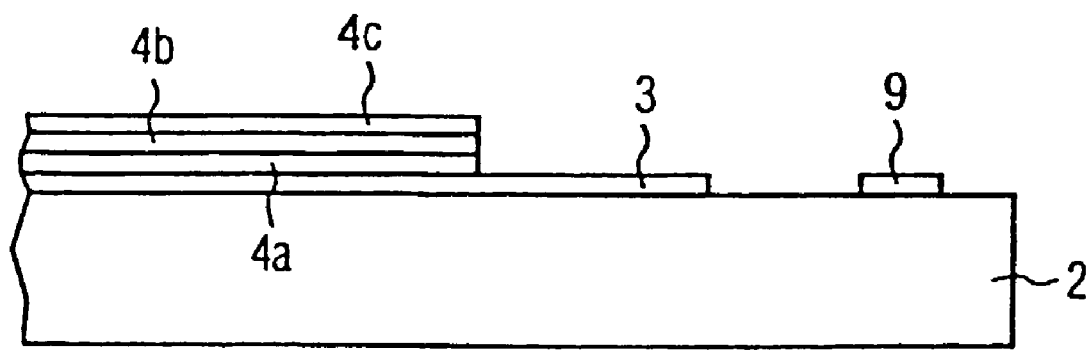

After that, the first active layer 4a is applied to the conductive layer 3. In this case, for example, the PPV can be applied to the conductive layer 3 by a "spin-coating" process and a "squeegee" technique. The second active layer 4b and the electrode 4c are then applied to the first active layer. The situation resulting from this is shown in FIG. 2.

The cover 5 is then provided. In order that that the seal 6 and the electrical contacts 8 can subsequently be produced in one operation, solder material is already provided on the underside of the cover 5. The solder materials used can be, for example, Au/Sn or Au/Ag. In this case, the solder material can be applied to the underside of the cover 5 by screen printing, for example. Furthermore, the cover 5 has conductor tracks 7, via which an electrical connection to the conductive layer 3 from the outside can be made. The cover 5 is held above the substrate 2 in such a way that the solder material for the seal 6 is arranged opposite the contact surface 9, and the solder material for the electrical contacts 8 is arranged opposite the exposed surface of the conductive layer 3. The situation resulting from this is shown in FIG. 3.

The cover 5 is then brought into contact with the substrate 2 and both the seal 6 and the solder joints 8 (electrical contacts) are produced by the use of laser beams 11. The laser beams 11 are in this case led through the glass substrate 2 and absorbed by the solder material. The production of the seal 6 and of the soldered joints 8 is carried out here in an inert gas atmosphere or in vacuum. The embodiment of the present invention shown in FIG. 1 is thus completed.

We claim:

1. A device for emitting electromagnetic radiation, comprising:
   a substrate;
   at least one active layer including a radiation-emitting organic material;
   a cover for covering said at least one active layer; and
   a seal disposed between said substrate and said cover such that an interior space formed between said substrate and said cover is sealed off in a gastight manner, said seal containing gold and a metal selected from the group consisting of tin and silver.

2. The device according to claim 1, wherein said seal is a metallic soldered joint.

3. The device according to claim 1, including a conductive layer disposed between said at least one active later and said substrate.

4. The device according to claim 3, wherein said conductive layer is an indium-doped tin oxide layer.

5. The device according to claim 1, including conductor tracks integrated into said cover.

6. The device according to claim 5, including:
   a conductive layer disposed between said at least one active layer and said substrate;
   soldered joints; and
   said conductor tracks integrated into said cover being connected to said conductive layer via said soldered joints.

7. The device according to claim 1, wherein said cover is a ceramic cover.

8. The device according to claim 7, wherein said ceramic cover is formed of $Al_2O_3$.

9. The device according to claim 1, wherein said radiation-emitting organic material is a light-emitting organic material.

10. A process of producing a device for emitting electromagnetic radiation, the method which comprises:
    providing a substrate;
    providing at least one contact surface on the substrate for a seal;
    applying at least one active layer formed of a radiation-emitting organic material; and
    sealing off an interior space formed between the substrate and a cover in a gastight manner by soldering the cover to the substrate via the at least one contact surface producing the seal, the seal containing gold and a metal selected from the group consisting of tin and silver.

11. The process according to claim 10, which comprises soldering the cover to the substrate in an inert gas atmosphere.

12. The process according to claim 10, which comprises providing a conductive layer between the at least one active layer and the substrate.

13. The process according to claim 10, which comprises providing an indium-doped tin oxide layer as a conductive layer between the at least one active layer and the substrate.

14. The process according to claim 10, which comprises integrating conductor tracks into the cover.

15. The process according to claim 10, which comprises:
    providing a conductive layer between the at least one active layer and the substrate;
    integrating conductor tracks into the cover; and
    connecting the conductor tracks to the conductive layer via soldered joints.

16. The process according to claim 15, which comprises producing the soldered joints simultaneously with the seal.

17. The process according to claim 10, which comprises producing the seal by using a laser beam.

18. The process according to claim 15, which comprises producing the soldered joints by using a laser beam.

19. The process according to claim 10, which comprises using a light-emitting organic material as the radiation-emitting organic material.

* * * * *